United States Patent [19]

Yokota et al.

[11] Patent Number: 4,504,298

[45] Date of Patent: Mar. 12, 1985

[54] PROCESS FOR PRODUCING INFRARED LIGHT TRANSMITTING OPTICAL FIBER

[75] Inventors: Minoru Yokota; Kazuhito Murakami; Kenichi Takahashi, all of Osaka, Japan

[73] Assignee: Sumitomo Electric Industries, Ltd., Osaka, Japan

[21] Appl. No.: 542,900

[22] Filed: Oct. 19, 1983

Related U.S. Application Data

[63] Continuation of Ser. No. 341,740, Jan. 22, 1980, abandoned.

[30] Foreign Application Priority Data

Jan. 23, 1981 [JP] Japan .................... 56-9518
Jan. 26, 1981 [JP] Japan .................... 56-10554

[51] Int. Cl.³ .............................. C03C 25/02
[52] U.S. Cl. ........................... 65/3.11; 65/2; 65/63; 350/96.34; 427/163
[58] Field of Search .......... 350/96.34; 72/282; 65/1, 2, 3.11, 13, 63; 427/163

[56] References Cited

U.S. PATENT DOCUMENTS

| | | | |
|---|---|---|---|
| 2,109,312 | 2/1938 | Dimmick | 72/282 X |
| 2,203,751 | 6/1940 | Simons | 72/282 X |
| 2,986,527 | 5/1961 | Redfield | 252/300 |
| 3,551,051 | 12/1970 | Salgo | 350/1.4 X |
| 4,253,731 | 3/1981 | Anderson et al. | 350/96.34 |

FOREIGN PATENT DOCUMENTS 2745  1/1977  Japan .................... 65/3.11

OTHER PUBLICATIONS

Infrared Fiber Optics Armour Research Foundation Contract #AF(616)6247, 12/1961, pp. 8-10.
WC 16 Infrared Fiber Optics Pontarelli et al., Optic Society of America Journal, 11/1960, vol. 50 #11, p. 1128.
Fiber Optics Principles and Applications Kampany, 1967, Academic Press, New York-London.

Primary Examiner—Robert Lindsay
Attorney, Agent, or Firm—Sughrue, Mion, Zinn, Macpeak, and Seas

[57] ABSTRACT

A process is disclosed for producing an infrared light transmitting optical fiber by drawing a rod of single crystal or polycrystalline metal halide into a fiber through a die; also disclosed is a process for producing an infrared light transmitting optical fiber of step-index type by forming around a single crystal or polycrystalline fiber core, an intimate cladding crystal layer having a lower refractive index than the core by working in the temperature range that does not cause recrystallization of the core or cladding during working.

20 Claims, 6 Drawing Figures (a)

(b)

(a)

(b)

PROCESS FOR PRODUCING INFRARED LIGHT TRANSMITTING OPTICAL FIBER

This application is a continuation of application Ser. No. 341,740, filed 1/22/82 abandoned.

FIELD OF THE INVENTION

The present invention relates to a process for producing a metal halide crystalline fiber for transmitting infrared light. The invention also relates to a process for producing an infrared light transmitting optical fiber having a refractive index distribution of step-index type (such an optical fiber is hereinafter referred to as a step-index type optical fiber).

BACKGROUND OF THE INVENTION

Recent types of optical fibers have generally been produced from quartz glass and have widely been used as light guides for transmitting information. However, quartz glass cannot transmit light rays whose wavelength is longer than about 2 $\mu$m, and, therefore, quartz glass fibers cannot be used as an infrared light guide. Infrared light transmitting optical fibers are expected to be used as fibers for connecting infrared light to a remote photodetector, e.g., an infrared light alarm or optical pyrometer. Alternatively, the fibers are used for directing high-power infrared light such as CO laser beams or $CO_2$ laser beams to a remote or otherwise inaccessible site for use, e.g., as a laser scalpel, laser heater, or laser working machine. For such various applications, demand for fiber that can transmit infrared light has recently increased. Most of the materials that transmit infrared light are crystalline, and such crystalline fibers can be produced from metal halide crystals such as silver halide and thallium halide crystals. However, such crystal fibers have been conventionally produced by methods other than drawing through a die. For example, N. S. Kapany, "Fiber Optics Principle and Applications" (Academic Press, New York, 1967), Chapter II Infrared Optics reports on drawing of infrared transmitting optical fibers, but this prior art reference does not describe drawing of crystalline materials through a die into a fiber.

A fiber is produced from these crystals by plastic working, and to minimize the resistance to deformation, hot extrusion is conventionally utilized as a technique of plastic working. However, if a fiber is to be produced from an extrusion billet of large size by a single step of extrusion, the necessary degree of working is increased and the fiber formed often tends to have a rough worked surface. Such a rough worked surface results in light scattering at surface defects in the fiber, which increases the loss in light transmission and/or decreases the mechanical strength of the fiber. These phenomena are factors that greatly impair the characteristics of the fiber.

Heretofore, a step-index type infrared light transmitting optical fiber has been produced by inserting a cylindrical core crystal into a hollow cylinder of cladding crystal to form an extrusion billet, which is then hot-extruded into a fiber. One defect of such a fiber is that, as shown in FIG. 1, the core crystal 11 and the cladding crystal layer 12 intermesh with each other since they are deformed during extrusion, and in consequence, a rough core-cladding interface is produced that increases the scattering of the light being transmitted.

SUMMARY OF THE INVENTION

One object of the present invention is therefore to provide a process for producing an infrared light transmitting crystalline fiber having a smooth surface and good mechanical properties when drawing a fiber through a die.

Another object of the present invention is to provide a process for producing an infrared light transmitting optical fiber of step-index type which comprises a single crystal or polycrystalline fiber core of a metal halide which has an intimate cladding crystal layer of a metal halide having a refractive index lower than that of the core.

The present invention achieves these objects and overcomes the defects of conventional techniques, by providing a process for producing an infrared light transmitting crystalline fiber by drawing a rod of single crystal or polycrystalline metal halide into a fiber through a die, and a process for producing an infrared light transmitting optical fiber of step-index type by forming around a single crystal or polycrystalline fiber core, an intimate cladding crystal layer having a lower refractive index than the core by means of working in a temperature range that does not cause recrystallization of the core or cladding during working.

DETAILED DESCRIPTION OF THE INVENTION

Figure 1:
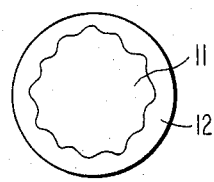
FIG. 1 is a cross-section of a conventional step-index type infrared light transmitting optical fiber.

In one embodiment of the present invention, an infrared light transmitting optical fiber can be produced by drawing a rod of single crystal or polycrystalline metal halide into a fiber through a die.

Suitable metal halide crystals that can be used in the present invention include silver halide and thallium halide crystals, as well as mixed crystals thereof.

The rod of single crystal or polycrystalline metal halide that is used in the present invention can be prepared by first forming a single crystal or polycrystalline metal halide by the crystal pulling method [S. Kyropowlous, Z. für Phys., 63 (1930), 849], the Bridgman method [D. C. Stockbarger, Rev. Sci. Instr., 7 (1936), 133] or the edge defined film feed growth method [EFG method, H. E. LaBelle, Jr. and A. I. Mlavsky: Mat. Res. Bull., 6, (1971), pp. 51-579, "Growth of Controlled Profile Crystals from the Melt", Part 1—Sapphire Filaments], and extruding the resulting billet into a rod of crystal. To minimize the resistance of the metal halide crystal to deformation, the extrusion may be performed under warm or hot conditions, instead of using cold conditions. The rod-shaped crystal can be formed not only by the extrusion method, but also by the Bridgman method using a crucible of small diameter. The extrusion method can be performed at a temperature below about 300° C.

The rod of single crystal or polycrystalline metal halide is drawn through a die several times into a crystalline fiber of a predetermined desired diameter. Since the metal halide crystal has small rupture strength, the drawing force should not be excessively great, and therefore, as described hereinafter, the percent reduction in cross-sectional area per pass through the die is preferably not greater than 20%. The percent reduction in cross-sectional area (R) can be defined as $$R = \{1 - (A_2/A_1)\} \times 100$$

wherein $A_1$ is a cross-sectional area of fiber before passing through a die and $A_2$ is a cross-sectional area of fiber after passing through a die. To decrease the drawing force and facilitate the drawing operation, a lubricant that decreases the friction coefficient is preferably supplied throughout the drawing. The lubricant can be supplied in the same manner as in the case of drawing a copper or aluminum wire, for example, by dropping a liquid lubricant to the metal halide fiber before passing through a die or dipping the die in a liquid lubricant thereby supplying the lubricant to the metal halide fiber during the drawing. Liquid lubricants, for example, mineral oils such as spindle oil, turbine oil and silicone oil, as well as fatty oils such as castor oil, palm oil, and whale oil are preferably used. Since the metal halide crystal being drawn is relatively soft, the presence of metal powders or other solid dusts in lubricants will damage the fiber or permit the dusts to be buried in the fiber. Therefore, a filtered lubricant or a high-purity lubricant is desireably used.

To further decrease the drawing force, the drawing temperature may be increased. In an experiment conducted by the inventors, it was found that the metal halide crystals and mixed crystals indicated in Table 1 could be drawn into a fiber smoothly at the temperature ranges indicated in Table 1. Since the metal halides become more corrosive at higher temperatures, a die made of a corrosion-resistant material is desirably used. A heat-resistant lubricant such as silicone oil is also preferably used for drawing at higher temperatures.

TABLE 1

| Crystalline Material | Drawing Temperature |
| --- | --- |
| Silver Chloride | Room Temp. to 250° C. |
| Silver Bromide | 40 to 250° C. |
| Thallium Bromide | Room Temp. to 250° C. |
| Mixed Crystal of Thallium Bromide and Thallium Iodide (at any ratio) | Room Temp. to 250° C. |

In a second embodiment of the present invention, a step-index type infrared light transmitting optical fiber that has a smooth core-cladding interface and significantly reduced scattering of transmitted light can be produced by forming, by means of working in a selected temperature range, an intimate cladding crystal layer of a metal halide around the core crystal prepared by extrusion or drawing through a die as in the first embodiment, preferably, by drawing through a die. The term "working" as used herein means drawing, rolling, extrusion and the like.

Figure 2:
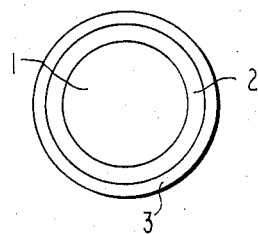
FIG. 2 is a cross-section of a step-index type infrared light transmitting optical fiber prepared in accordance with the process of this invention.

The second embodiment of the present invention is now described in detail by reference to FIGS. 2 to 4. FIG. 2 is a cross section of a step-index type optical fiber prepared according to the second embodiment of the process of the present invention. In FIG. 2, 1 is a single crystal or polycrystalline fiber core. The fiber core can be produced in the same manner as described for the first embodiment, but preferably, the polycrystalline fiber is prepared, for example, by hot extrusion or cold-drawing through a die, and the single crystal fiber is prepared by, e.g., the EFG method. The numeral 2 indicates a cladding crystal layer having a lower refractive index than the core 1 and which is formed around the core in intimate contact therewith. The cladding layer 2 is formed by working in a temperature range that does not cause recrystallization of the core or cladding during working. The expression "the temperature range that does not cause recrystallization of the core or cladding during working" means a range wherein the structure being worked does not recrystallize to cause intermeshing of the core crystal with the cladding crystal to form a rough core-cladding interface, and empirically, the temperature lower than about half of the melting point temperature (by the absolute scale, i.e., °K.) of each crystal can be selected.

As described above, the cladding crystal layer has a lower refractive index than the core. For example, silver chloride and silver bromide have a refractive index of about 2 and about 2.2, respectively, as determined at 10 μm and, therefore, in the second embodiment of the present invention, silver chloride can be used as a cladding and silver bromide can be used as a core. Also, silver chloride and silver bromide form a solid solution at any proportion and may form a mixed crystal. A mixed crystal comprising a higher proportion of silver chloride can be used as a cladding and a mixed crystal comprising a higher proportion of silver bromide can be used as a core. Similarly, thallium chloride, thallium bromide and thallium iodide have a refractive index of about 2, 2.3 and 2.4, respectively, as determined at 10 μm and these thallium halides can be used as cladding and core, for example, a combination of thallium chloride as a cladding and thallium bromide as a core, a combination of thallium bromide as a cladding and thallium iodide as a core. Similar to silver halides, thallium chloride and thallium bromide, or thallium bromide and thallium iodide can form a solid solution at any proportion and a mixed crystal of these combinations can be used as a cladding or a core. For example, a mixed crystal KRS-5 (TlBr 45.7 mol% and TlI 54.3 mol%) can be used as a core in combination with thallium bromide as a cladding, or KRS-5 can be used as a cladding in combination with thallium iodide as a core. Thallium halides generally have a refractive index higher than silver halides, and, when these halides are used in combination, a thallium halide is used as a core and a silver halide is used as a cladding.

Figure 3:
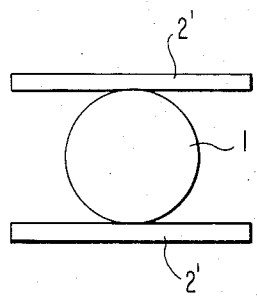
FIGS. 3(a) and 3(b) and FIGS. 4(a) and 4(b) show steps for the embodiments other than the pipe-fitting method.
Figure 3:
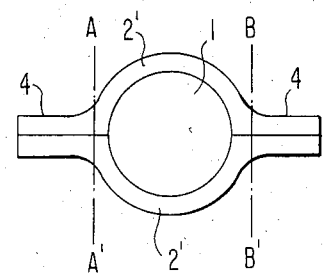
Figure 4:
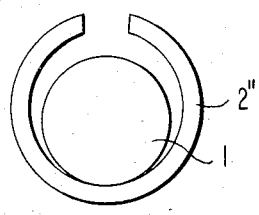
Figure 4:
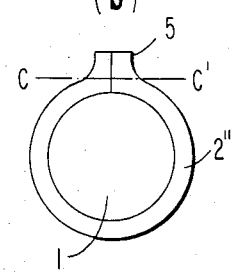

Specific techniques of the working in a temperature range that does not cause recrystallization of the core or cladding include rolling and drawing through a die, and typical embodiments of the formation of a cladding crystal layer are illustrated in FIGS. 2 to 4. The optical fiber shown in cross section in FIG. 2 can be prepared by a pipe fitting method wherein a core 1 is inserted in the hollow part of a pipe 2 that is made of an infrared light transmitting material and which serves as a cladding layer, and the pipe 2 is drawn through a die to form a fiber having no clearance between the core and cladding. If necessary, a protective layer 3 may be formed around the cladding. A fiber produced by this method preferably has core and cladding diameters close to the final dimensions achieved by the finishing drawing. Since the pipe fitting by the drawing method is a working of slight degree for the particular purpose of providing close contact between the core and cladding, rough interface as shown in FIG. 1 is not produced. In other words, working under extreme conditions that produce a rough interface is not appropriate.

FIG. 3 shows in sequence another example of the second embodiment according to the present invention using a method other than the pipe fitting method. As shown in FIG. 3(a), a core 1 is held between two thin sheets of an infrared light transmitting cladding material 2', 2', and the core and cladding combination is cold-rolled by grooved rolls to form the thin sheet coatings 2' and 2' in intimate contact with the periphery of the core 1 as shown in FIG. 3(b). Burrs 4 and 4, formed on opposite sides of the cross section may be cut along the lines A—A' and B—B' to provide a fiber having a substantially circular cross section.

FIG. 4 shows in sequence still another example of the second embodiment of the present invention using a method other than the pipe fitting method. As shown in FIG. 4(a), a thin sheet 2" serving as a cladding is shaped into a tubular form by roll forming around a core 1, and the core and cladding combination is cold-rolled by grooved rolls to form the thin sheet coating 2" in intimate contact with the periphery of the core 1 as shown in FIG. 4(b). Any burr such as indicated by 5 is removed by cutting or turning along the line C—C'.

The core crystal and cladding crystal layer used in the present invention to achieve its second object is made of the crystal of a metal halide such as silver halide or thallium halide or mixed crystal thereof. The higher the purity of these materials that are used, the smaller the resistance to deformation of the crystal under cold rolling or drawing through a die, and the more easily the crystal can be worked into a fiber. If the crystal is a mixed crystal, the crystal is preferably worked at elevated temperatures within a range that does not cause recrystallization of the core or cladding.

The infrared light transmitting optical fiber produced by the process of the present invention may simply consist of the core 1 and the cladding crystal layer 2, but as shown in FIG. 2, the cladding crystal layer 2 may be further coated with a protective layer 3. The protective layer 3 may be formed, e.g., by applying and baking a highly corrosion-resistant material such as a polyester imide resin, polyester resin, polyurethane resin, polyimide resin, tetra-fluoride resin, silicone resin, epoxy resin, cyanoacrylate resin or a mixture thereof, or by melt-extruding an acrylonitrile-butadiene-styrene copolymer resin, polybutadiene resin, polypropylene resin, polyethylene resin, polycarbonate resin, polyvinyl chloride resin, polyphenylene oxide resin, polysulfone resin or a mixture thereof over the cladding layer, and, if desired, by extruding lead, lead-tin alloy, aluminum or aluminum alloy, or other low-melting metals over the cladding layer. Examples of low-melting metals which can be used are silver alloy soft solder such as Plumbsol (a trade name of Johnson Mathey Co., Ag 3.5%—Sn 96.5%, melting point, 221°-225° C.), silver soft solder (Ag 50%—Cu 15.5%—Ni 3%—Zn 15.5%—Cd 16%, melting point, 410° C.), soft solder (Sn 63%—Pb 37%, melting point, 183° C.) and the like. The resin or metal protective layer need not be a single layer, and, if desired, a plurality of metal or resin protective layers may be formed. Since the silver halides and thallium halides generally have a higher thermal expansion coefficient than the metals used as a metal protective layer, it is advantageous to provide a resin layer as a cushioning layer directly on the metal halide fiber and a metal layer on the resin layer. A protective layer 3 isolates the core 1 and cladding crystal layer 2 from the atmosphere and external light, and prevents the optical and mechanical characteristics of the fiber from being impaired by moisture, visible light and ultraviolet rays, and at the same time, it protects the fiber from external mechanical stresses imposed on infrared light transmission. Therefore, the process of the present invention is capable of producing an infrared light transmitting optical fiber that is easy to handle and which yet has great durability.

The present invention is further illustrated by the following Examples, but is not limited thereby.

EXAMPLE 1

A silver chloride crystal in a cylindrical form 15 mm in diameter and 40 mm long was formed by the Bridgman method, and the crystal was used as an extrusion billet which was extruded into a silver chloride rod (3 mm in diameter) at about 300° C. The rod was drawn several times through conical super hard alloy dies (semicone die angle: 12°) to finally form a crystalline fiber having a diameter of 0.5 mm, while dropping silicone oil as a lubricant to the fiber before passing through each die. For comparative purposes, five sets of dies, having reductions in area of 5, 10, 15, 20 and 25% per pass, respectively, were used. The greater the reduction in area, the greater the drawing force required, and with a reduction in area of 20% or less, a crystalline fiber having smooth surface could be produced with ease. However, with a reduction in area of 25%, the crystalline fiber obtained did not have a completely smooth surface, and it was easy to break. After the crystal was drawn into the predetermined size, the lubricant was removed by ultrasonic cleaning with pure water.

The crystalline fiber thus-produced by the method of the present invention had a smooth surface and exhibited good mechanical and optical properties desired for use as an infrared light transmitting fiber.

EXAMPLE 2

A step-index type infrared light transmitting optical fiber with a protective coating as shown in FIG. 2 was produced by the method illustrated in FIG. 3, as follows. An extrusion billet (15 mm diameter and 40 mm long) was formed by the Bridgman method from a silver bromide crystal of high purity. The billet was hot-extruded (at about 300° C.) into a silver bromide rod (3 mm in diameter). The rod was drawn several times through conical super hard alloy dies (semicone die angle: 12°) using a silicone oil as a lubricant to finally form a crystalline fiber core 1 having a diameter of 0.7 mm. A silver chloride crystal was cold-rolled into two thin sheets 2' 0.1 mm thick and 4 mm wide. The silver bromide core 1 was sandwiched between the two thin silver chloride sheets, and the core and cladding combination was cold-rolled through grooved rolls (three passes) to provide a fiber comprising the core 1 having the cladding sheets 2' and 2' around it in intimate contact. The burrs 4 and 4 were cut off with a chrome-plated knife edge to provide a step-index type infrared light transmitting optical fiber having a generally circular cross section. A protective layer 3 made of polyethylene resin was extruded over the cladding to form an optical fiber having an outside diameter of about 1 mm.

The fiber was cut into a length of 50 cm, which was subjected to spectral analysis by being inserted between the light source and detector of a single beam infrared spectrometer. The fiber had a light transmittance between about 55 and 65% in a wavelength range of from 2 to 12 μm when the reflection loss at both ends of the fiber was taken into account. This data shows that the fiber produced by the present invention is suitable for detection of the light issued from an object having a temperature of from about 300° to 2,000° K., and can thus be used in temperature measurement.

As described in the foregoing, the present invention forms, around a single crystal or polycrystalline fiber core, an intimate cladding crystal layer having a lower refractive index than the core by working in a temperature range that does not cause recrystallization of the core or cladding during cold or warm working. In the process of the present invention, the core crystal does not intermesh with the cladding crystal at their interface as they occur during the working, and therefore, a smooth core-cladding interface can be produced and undesired scattering of light being transmitted through the fiber can be decreased significantly. As a result, a step-index type infrared light transmitting optical fiber having high efficiency in transmission of infrared light can be produced according to the present invention.

An advantage of the present invention is that a rod of single crystal or polycrystalline metal halide can be drawn into a fiber through a die, and working conditions such as reduction in area and working temperature can be properly selected and a suitable lubricant can be used to enable the large-quantity production of thin fiber having a smooth worked surface. As a further advantage, the process of the present invention is capable of producing an infrared light transmitting crystalline medium having good mechanical and optical properties and which is suitable for use as a core of infrared light transmitting optical fibers. Furthermore, the present invention offers an effective process for producing an infrared light transmitting optical fiber that exhibits good optical performance and which is well suited for use in an infrared light alarm, optical pyrometer, laser scalpel, laser heater, or laser working machine such as a machine or apparatus for welding, brazing, soldering, or melt-cutting by directing laser beams through the fiber to the desired site.

While the invention has been described in detail and with reference to specific embodiments thereof, it will be apparent to one skilled in the art that various changes and modifications can be made therein without departing from the spirit and scope thereof.

What is claimed is:

1. An improved process for producing a step-index infrared light transmitting optical fiber by drawing a rod of single crystal or polycrystalline silver halide, thallium halide, or a mixed crystal thereof into a fiber core through a die, forming around said fiber core an intimate cladding crystal layer having a lower refractive index than the core, wherein the improvement comprises plastic working the core and the cladding by rolling or drawing through a die in a temperature range that does not cause recrystallization of the core or cladding during working, whereby the crystal grains of the core and the crystal grains of the cladding crystal do not intermesh with each other and thereby retain their initial surface smoothness.

2. A process according to claim 1, wherein the drawing through a die is performed in such a manner that the reduction in the cross-sectional area per pass is not more than 20%.

3. A process according to claim 1, wherein the working in a temperature range that does not cause recrystallization of the core or cladding during working is conducted by rolling or drawing through a die.

4. A process according to claim 1 or 3, wherein the core and cladding crystal layer are produced from a silver halide, a thallium halide, or a mixed crystal thereof.

5. A process according to claim 1 or 3, wherein the cladding crystal layer is further coated with a resin or metal protective layer by extrusion, or by coating and baking.

6. A process according to claim 4, wherein the cladding crystal layer is further coated with a resin or metal protective layer by extrusion, or by coating and baking.

7. A process according to claim 1, or 3, wherein the drawing through a die is performed using a liquid lubricant.

8. A process according to claim 7, wherein the liquid lubricant is selected from the group consisting of silicone oil, spindle oil, turbine oil, castor oil, palm oil, and whale oil.

9. A process according to claim 4, wherein the drawing through a die is performed using a liquid lubricant.

10. A process according to claim 9, wherein the liquid lubricant is selected from the group consisting of silicone oil, spindle oil, turbine oil, castor oil, palm oil, and whale oil.

11. The process according to claim 1, wherein the core is held between two thin sheets of a cladding crystal material, wherein the core and the cladding combination is cold-rolled by grooved rolls to form the cladding material into a cladding crystal layer in intimate contact with the periphery of the core.

12. The process according to claim 1, wherein a thin sheet of infrared light transmitting cladding crystal material is shaped into a tubular form by roll forming around the core, and the core and cladding combination is cold-rolled by grooved rolls to form a cladding crystal layer in intimate contact with the periphery of the core.

13. The process according to claim 1, wherein the core is inserted in the hollow part of a pipe that is made of an infrared light transmitting cladding material, and the pipe is drawn through a die to form the cladding material into a cladding crystal layer in intimate contact with the periphery of the core.

14. The process according to claim 13, wherein a protective layer is formed around the cladding layer.

15. The process according to claim 14, wherein the protective layer is formed by applying and baking a highly corrosion-resistant material.

16. The process according to claim 15, wherein the material used in forming the protective layer is selected from the group consisting of polyester imide resin, polyester resin, polyurethane resin, polyimide resin, tetrafluoride resin, silicone resin, epoxy resin, cyanacrylate resin and a mixture thereof.

17. The process according to claim 14, wherein the protective layer is formed by melt-extruding a material selected from the group consisting of acrylonitrile-butadiene-styrene copolymer resin, polybutadiene resin, polypropylene resin, polyethylene resin, polycarbonate resin, polyvinyl chloride resin, polyphenylene oxide resin, polysulfone resin and a mixture thereof over the cladding layer.

18. The process according to claim 14, wherein the protective layer is formed by extruding a low-melting metal over the cladding layer.

19. The process according to claim 14, wherein a plurality of metal and/or resin protective layers are formed over the cladding layer.

20. The process according to claim 19, wherein a resin layer is formed directly on the cladding layer and the metal layer is then formed on the resin layer.

* * * * *

UNITED STATES PATENT AND TRADEMARK OFFICE
CERTIFICATE OF CORRECTION

PATENT NO. : 4,504,298

DATED : March 12, 1985

INVENTOR(S) : Minoru Yokota; Kazuhito Murakami; Kenichi Takahashi

It is certified that error appears in the above-identified patent and that said Letters Patent is hereby corrected as shown below:

Title page:

Line [63], please change "Jan. 22, 1980" to --Jan. 22, 1982--.

Signed and Sealed this

Fifteenth Day of September, 1987

Attest:

DONALD J. QUIGG

*Attesting Officer*  *Commissioner of Patents and Trademarks*